(12) United States Patent
Stutz (10) Patent No.: US 10,120,077 B2
(45) Date of Patent: Nov. 6, 2018

(54) DISTANCE MEASURING METHOD AND DISTANCE MEASURING ELEMENT

(71) Applicant: LEICA GEOSYSTEMS AG, Heerbrugg (CH)

(72) Inventor: Reto Stutz, Berneck (CH)

(73) Assignee: LEICA GEOSYSTEMS AG, Heerbrugg (CH)

( * ) Notice: Subject to any disclaimer, the term of this patent is extended or adjusted under 35 U.S.C. 154(b) by 492 days.

(21) Appl. No.: 14/406,475

(22) PCT Filed: Jun. 24, 2013

(86) PCT No.: PCT/EP2013/063144
§ 371 (c)(1),
(2) Date: Dec. 8, 2014

(87) PCT Pub. No.: WO2014/001258
PCT Pub. Date: Jan. 3, 2014

(65) Prior Publication Data
US 2015/0160346 A1 Jun. 11, 2015

(30) Foreign Application Priority Data

Jun. 27, 2012 (EP) .................................... 12173909

(51) Int. Cl.
*G01C 3/08* (2006.01)
*G01S 17/88* (2006.01)
(Continued)

(52) U.S. Cl.
CPC ............ *G01S 17/88* (2013.01); *G01S 7/4861* (2013.01); *H03M 1/1245* (2013.01)

(58) Field of Classification Search
CPC ..... G01S 17/08; G01S 7/4861; H03M 1/1245
See application file for complete search history.

(56) References Cited

U.S. PATENT DOCUMENTS 4,958,231 A * 9/1990 Tsuchiya ................... G01J 1/42
250/214 VT
6,122,602 A 9/2000 Michalski et al.
(Continued)

FOREIGN PATENT DOCUMENTS

CN 101162238 A 4/2008
CN 201130251 Y 10/2008
(Continued)

OTHER PUBLICATIONS

European Search Report dated Oct. 2, 2012 as received in Application No. EP 12 17 3909.

*Primary Examiner* — Samantha K Abraham
(74) *Attorney, Agent, or Firm* — Maschoff Brennan (57) ABSTRACT

The invention relates to a distance measuring method comprising at least the step of emitting at least one measurement signal to a target object, in which at least one start signal is produced, and the measurement signal is back scattered from the target object as a target signal. Said target signal is sampled at a sampling frequency and the relative position of the start signal and the target signal is determined for deriving a distance to the target object from the relative position from the start signal and the target signal. The sampling frequency can be adjusted and is set in accordance with a large distance to the target object.

20 Claims, 10 Drawing Sheets

(51) Int. Cl.
*G01S 7/486* (2006.01)
*H03M 1/12* (2006.01)

(56) References Cited

U.S. PATENT DOCUMENTS

| | | | |
|---|---|---|---|
| 7,623,222 | B2 | 11/2009 | Benz et al. |
| 7,760,337 | B2 | 7/2010 | Yang |
| 7,911,589 | B2 | 3/2011 | Siercks |
| 2008/0304043 | A1* | 12/2008 | Benz ................... G01S 7/4861 356/5.01 |

FOREIGN PATENT DOCUMENTS

| | | |
|---|---|---|
| EP | 0 875 772 A2 | 11/1998 |
| EP | 1 672 382 A1 | 6/2006 |
| EP | 1 882 959 A1 | 1/2008 |
| WO | 03/089950 A2 | 10/2003 |
| WO | WO2003089950 * | 10/2003 |
| WO | 2008/009387 A1 | 1/2008 |
| WO | 2011/076907 A1 | 6/2011 |

* cited by examiner

DISTANCE MEASURING METHOD AND DISTANCE MEASURING ELEMENT

FIELD OF THE INVENTION

The invention relates to a distance measuring method and to a distance measuring element.

BACKGROUND

Various principles and methods are known in the field of electronic and electro-optical distance measurement. One approach consists in emitting pulsed electromagnetic radiation, such as e.g. laser light, to a target to be measured and then receiving an echo from said target as a backscattering object, wherein the distance to the target to be measured is determined on the basis of the time of flight of the pulse. Such pulse time-of-flight measuring elements have gained acceptance in the meantime as standard solutions in many fields.

Various approaches are used for detecting the backscattered pulse.

The so-called threshold value method involves detecting a light pulse if the intensity of the incident radiation exceeds a certain threshold value.

Another approach is based on the sampling of the backscattered pulse. An emitted signal is detected by virtue of the fact that the radiation detected by a detector is sampled, a signal is identified within the sampled region and, finally, the position of said signal is determined. By using a multiplicity of samples, it is possible to identify a useful signal even under unfavorable circumstances, such that it is possible to cope with even relatively large distances or background scenarios that are noisy or beset by disturbances. In the prior art, sampling is effected by sampling many identical pulses with the time window or phase being shifted, wherein at the present time it is possible to realize very fast circuits having a frequency high enough to sample individual pulses.

The requirements made of the signal sampling and the prerequisites for signal reconstruction are problematic, however, particularly with the use of variable or distorted signals. On account of the sampling rates that are subject technically to upper limits, not all signal components can be sampled in the same way. If the so-called Nyquist sampling theorem is not complied with, then so-called aliasing effects can occur, which corrupt the signal reconstruction and thus reduce the measurement accuracy. The prior art discloses solutions here which nevertheless accept a slight violation of the Nyquist condition or else reduce the higher-frequency signal components by filtering to an extent such that the Nyquist condition can be fulfilled for the filtered signal.

In this regard, WO 2011/076907 discloses a device for highly accurate distance measurement according to the principle of direct sampling of the reflected signal, wherein the reception signal is sampled by a sampling circuit and subsequently quantized. Upstream of the sampling, a high-order filter is allocated to the reception signal path. Said filter is typically a 6th order filter or higher order filter and, unlike in the case of the other devices according to the prior art, is not designed as a simple 1st, 2nd or at most 3rd order antialiasing filter. In the case of such a distance measuring method, a complete identification of the waveform is no longer absolutely necessary. Since, before sampling, the signal bandwidth is reduced such that all frequencies relevant to the distance are below half the sampling frequency, according to the Nyquist theorem the distance-relevant signal that then remains and suffices for the intended measurement purpose can be completely reconstructed by algorithmic means and its exact position can therefore also be determined. The measurement still functions even in the case of varying signals and the accuracy can be increased by this approach. The prerequisite guides a reconstruction is, however, that the dominant portion of the signal must lie within a Nyquist band, the first frequency band preferably being used.

It is true that other methods or devices from the prior art comply with the Nyquist or Shannon condition to a first approximation. In this case, the bandwidth BW or the 3 dB fall-off point f3 dB of the signal spectrum is limited to frequencies below the Nyquist limit frequency fg. However, since the fall-off of the spectrum at frequencies above the BW or f3 dB is without exception too moderate on account of the low filter order, the Shannon theorem is not fulfilled 100% and the suppression of aliasing effects for a precise, offset-free distance measurement is not provided.

The solutions in the prior art thus use sophisticated filter concepts that ensure compliance with the sampling theorem, but they are unable to avoid aliasing effects to the extent required for highly precise measurements.

SUMMARY

Some embodiments of the present invention provide a novel distance measuring method and a novel distance measuring element by which these disadvantages are avoided or reduced.

Some embodiments provide a highly accurate distance measuring element and a distance measuring method without the need for filtering or else a reduced outlay on filtering before the sampling process.

Some embodiments provide a distance measuring element which enables accurate measurements even in the case of nonlinearly distorted pulses, such as e.g. in the case of signal saturation.

Some embodiments provide a distance measuring element which makes it possible even to use higher-frequency signal components, in particular without restriction by the Shannon theorem.

Some embodiments provide a highly accurate distance measuring element which allows highly accurate measurement even with a simplified construction, in particular with slower analog-to-digital converters.

In particular, some embodiments further develop a distance measuring element according to the time-of-flight measuring method with signal sampling such that an absolute accuracy in the mm range or in the sub-mm range is ensured. The precision class of the distance measuring element according to the phase measuring principle is ideally intended to be achieved here.

The invention relates to distance measuring elements which emit a measurement signal to a target object whose distance is to be measured and, after an interaction with the target object, receive the reflected signal component again as a target signal and evaluate it. Light in the visible or invisible spectral range is typically used for this purpose, said light being generated for example by a laser diode, a solid-state laser, such as e.g. a Q-switched microchip laser, or an LED. In principle, however, the approach according to the invention can also be used for other types of measurement signal, such as e.g. ultrasonic measuring elements. In the case of laser distance measuring elements of the generic type, the distance is usually determined according to the time-of-flight measurement principle, i.e. from the temporal difference between reception of the start signal and of the target signal, at least the target signal being sampled for digitization.

The solution according to the invention is based on such an approach of sampling of the target signal by means of an analog-to-digital converter, but in contrast to the prior art sampling rates or frequencies are adapted in a targeted manner by adjustment for this purpose. A prerequisite for this is the knowledge of a coarse distance for the distance to be measured to a target object, which constitutes the prerequisite for the subsequent adaptation of the sampling rate. Such a coarse distance can be estimated by means of a directly preceding measurement, wherein fundamentally measurements both according to a principle identical to the actual measurement and according to a different principle can be used. Likewise, the coarse distance can also be predefined, e.g. by means of a table in which coarse distances or the respective last measured distance are/is assigned to targets. Such configurations are typical e.g. in construction site monitoring, wherein for a relatively large structure a multiplicity of measurement points are measured at certain time intervals, such that a possible variation is identified. For the respective current measuring process, the coarse distance is then previously known as the last measured distance or else as a setpoint distance, such that an optimum sampling frequency can be chosen in a targeted manner on the basis of the knowledge of said coarse distance.

A suitable method according to the invention for coarse distance measurement is provided by the so-called threshold value method, in which a light pulse is detected as a target signal if the intensity of the incident radiation exceeds a certain threshold value. This threshold value prevents noise and interference signals from the background from being detected incorrectly as a useful signal, i.e. as backscattered light of the emitted pulse. What is problematic, however, is that in the case of weak backscattered pulses, such as are caused for example by relatively large measurement distances, a detection is no longer possible if the pulse intensity falls below the detection threshold. The major disadvantage of this threshold value method, therefore, is that the amplitude of the measurement signal must be sufficiently greater than the noise amplitude of optical and electrical noise sources in the signal path in order to sufficiently minimize incorrect detections. In this case, a coarse distance measurement according to the threshold value method can use at least some of the components that are also used for the sampling of the signal in the subsequent accurate measuring method, such that a low equipment outlay is possible.

By virtue of the targeted choice of an optimal sampling rate, the relative positions of the sampling points in relation to the signal profile are set such that aliasing effects are reduced or suppressed. In particular, the sampling rate is adapted such that signals with an identical relative position in relation to the sampling pattern are sampled, wherein e.g. the peak point of a signal profile can serve as reference variable with regard to the position. The sampling of the same locations in the signal profile of the target and start signals is thus carried out with reference to a characteristic feature of the pulse profile, in this case the peak point. The sampling rate of the analog-to-digital converter and thus the sampling points of a sampling pattern defined by the sampling rate are thus adapted to a distance range, wherein effects that otherwise arise as a result of aliasing can be canceled or else taken into account algorithmically.

After the sampling process, the distance is determined by means of time-of-flight methods, i.e. on the basis of a time measurement between the signals, to which time measurement a distance is assigned. Typically, individual pulses can be emitted in this case, but it is also possible according to the invention to use more complex signal structures or signal patterns.

The setting of the sampling rate or sampling frequency can be used with various approaches.

A first approach uses a start signal which corresponds to the target signal and which is generated before or upon the emission of the measurement signal, e.g. by the use of an internal reference path via which part of the measurement signal is passed to the receiver internally in the device. Said start signal is likewise sampled by the receiver or the analog-to-digital converter in a manner identical to the target signal. By varying the sampling rate, it is possible for the sampling pattern assigned to the respective rate to be shifted such that the start and target signals are sampled in an identical manner, i.e. at identical points of the signal profile. Consequently, a complete reconstruction or subsampling interpolation of the pulse is no longer necessary as long as the sampling rate is chosen such that the spacing of the two pulses corresponds to an integral multiple of the sampling interval, i.e. of the spacing between the sampling points. Both signals are then sampled at the same locations and thus in a directly comparable manner. Consequently, the sampling frequency of the analog-to-digital converter is set with knowledge of the coarse distance such that both signals lie identically, i.e. with an identical relative position with respect to the sampling points, in the sampling pattern. Errors that occur as a result of aliasing are duplicated during the sampling of both signals, i.e. both of the target signal Z and of the start signal S, and can thus be subtracted or eliminated upon a comparison of both signals, if appropriate after amplitude matching.

In order to compare signals having different waveforms, the amplitude of the start pulse can be matched by means of a variable optical filter until the signal waveform of the start signal S corresponds to the signal waveform of the target signals Z apart from a scaling factor. In this case, too, the errors that occur as a result of aliasing or nonlinear signal distortion are duplicated on both signals Z and S and can thus once again be eliminated upon a comparison of both signals.

This approach can also be used for coarse distance measurement if e.g. a first sampling process that is not yet set optimally is used as a prior measurement for determining the coarse distance. The coarse distance determined by means of non-optimum sampling can then be taken as a basis for choosing the optimum sampling rate for this distance.

A different approach considers the target signal in an isolated way. For this purpose the sampling pattern is set by varying the sampling rate in relation to the signal profile such that the aliasing effect is reduced or eliminated. For this purpose, previously ascertained optimum setting or sampling rates can be kept available in tabular form. In such an approach, the start signal used can also be an electronically generated start signal, for example, which need not be a copy of the target signal. Therefore, if only the target signal is used, then the optimization of the signal position consists in putting said signal into an optimum position—for the evaluation—with respect to the sampling pattern. By way of example, the target signal can be placed into the sampling pattern such that the first derivative of the target signal at one sampling point or a set of sampling points assigned to temporal intervals is as large as possible, which corresponds to a maximization of the signal change per distance change.

In principle, the approach according to the invention can also be combined with methods from the prior art. In this regard, in particular, filter methods, as described in WO 2011/076907, for example, can also be used.

BRIEF DESCRIPTION OF THE DRAWINGS

The distance measuring method according to the invention and the distance measuring element according to the invention are described in greater detail purely by way of example below on the basis of exemplary embodiments illustrated schematically in the drawing.

In the figures, specifically.

DETAILED DESCRIPTION

Figure 1:
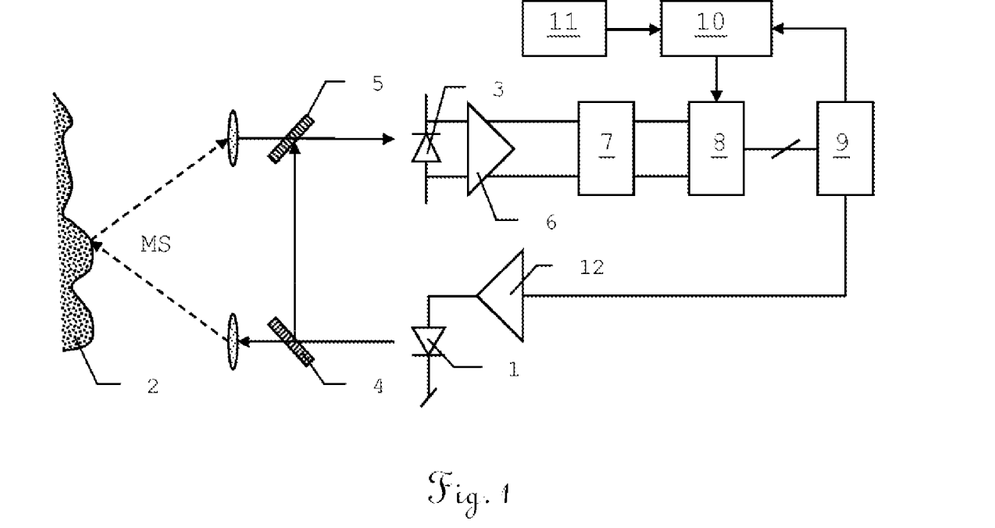
FIG. 1 shows a block diagram of one exemplary embodiment of the distance measuring element according to the invention.

FIG. 1 shows a block diagram of one exemplary embodiment of the distance measuring element according to the invention. The distance measuring element comprises at least one measurement signal source 1 for emitting at least one measurement signal MS, in particular a light signal, to a target object 2, wherein at least one start signal is generated. In particular, laser diodes, solid-state lasers or LEDs are appropriate as measurement signal source 1. The start signal can be provided as an electronically generated signal or else, as in this exemplary embodiment, can be generated by the splitting or changeover of the measurement signal MS. For this purpose, the measurement signal MS is passed e.g. via a beam splitter 4 and subsequently emitted to the target object 2. The other part of the measurement signal MS is passed via a device-internal reference path to a further beam splitter 5, where it is coupled back into the reception beam path. These arrangements thus define a device-external measurement section and a device-internal reference section, wherein the start signal is provided by coupling-out and the device-internal beam guiding. Besides the coupling-out by means of a beam splitter 4, it is also possible to realize successive passage through device-external measurement section and device-internal reference section, e.g. by means of a changeover element which releases in each case only one of the sections and is switched back and forth.

The measurement signal MS reflected from the target object 2 is passed to a receiver 3 for detection, where it is detected as a target signal and, downstream of an amplifier stage 6, is sampled by a downstream sampling circuit comprising an analog-to-digital converter 8 for determining the relative position of start signal and target signal. The sampling by the analog-to-digital converter 8 can be preceded by a filtering by a low-pass or bandbass filter 7. The distance to the target object is determined from the relative position of start signal and target signal in a control and evaluation component 9.

For this purpose, the sampling circuit is designed such that the target signal is sampled with an adjustable and settable sampling rate, such that the sampling rate and thus the sampling behavior can be adapted to a previously known or previously ascertained coarse distance to the target object 2. In this case, the analog-to-digital converter 8 is controlled by the control and evaluation component 9 via a frequency generator 10, in particular a synthesizer, preferably a direct digital synthesizer or a voltage-controlled and phase-locked-loop-based integer-N synthesizer, with reference clock 11 for frequency synthesis. The control and evaluation component 9 additionally controls the measurement signal source 1 via an amplifier stage 12, wherein the frequency of the measurement signal source 1 can also be correspondingly adjusted via a further frequency generator (not illustrated here), such that the frequencies of both receiver and source can be correspondingly adapted. Depending on the configuration, the sampling rate can be manually or preferably automatically set or adapted to the coarse distance.

In this exemplary embodiment, the coarse distance measurement is carried out according to the same principle as the subsequent more precise measurement, such that two measurement signals respectively passed via device-external measurement section and device-internal reference section sampled successively with different sampling rates. In this case, during each sampling process, start and target signals are analyzed jointly with one sampling rate in one process. The first sampling process thus supplies the coarse distance measurement, on the basis of which the sampling rate for the second, more accurate measuring process is subsequently set in a targeted manner.

Alternatively, the coarse distance measurement can also be realized by means of a time-of-flight-measuring measurement circuit (not illustrated here), which is designed such that the backscattered measurement signal MS is detected if the intensity thereof exceeds a predefined threshold value. For such a measurement it is possible to use at least some of the components used for the fine measurement. An integration—suitable according to the invention—of sampling functionality and threshold-value-measuring functionality is described in WO 2008/009387, for example.

However, it is likewise possible according to the invention to use a dedicated coarse distance measurement signal source and a coarse distance receiver, wherein these are designed and arranged such that they define a second measurement path independent of the measurement signal source and the receiver. Besides the threshold value method, it is also possible to use other distance measuring methods from the prior art, for example methods according to the triangulation principle.

Likewise, the coarse distances can also be taken from a storage unit for storing coarse distances for previously known target objects. Such solutions are particularly suitable if static target objects or target objects whose position is known are intended to be measured multiply, as is the case for example for construction site monitoring or when testing dimensional accuracies. Here the coarse distances are known as results of earlier measurements or as predefined setpoint variables, such that for each measuring process, on the basis of these values, a suitable or optimal sampling rate can be chosen and set directly without directly preceding coarse measurement.

Figure 2:
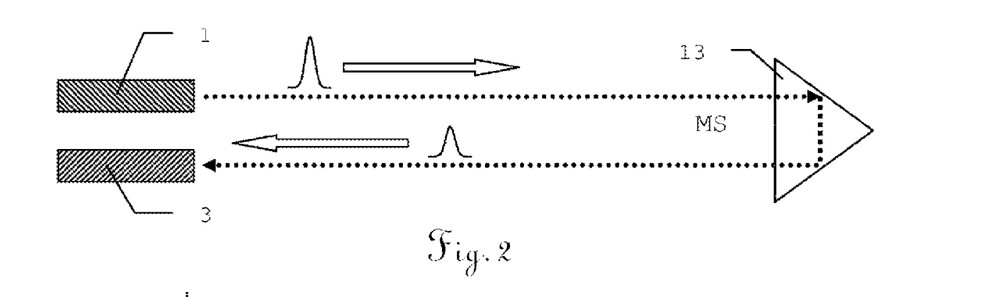
FIGS. 2-3 show the basic illustration of a distance measuring element according to the time-of-flight measuring principle according to the prior art.
Figure 3:
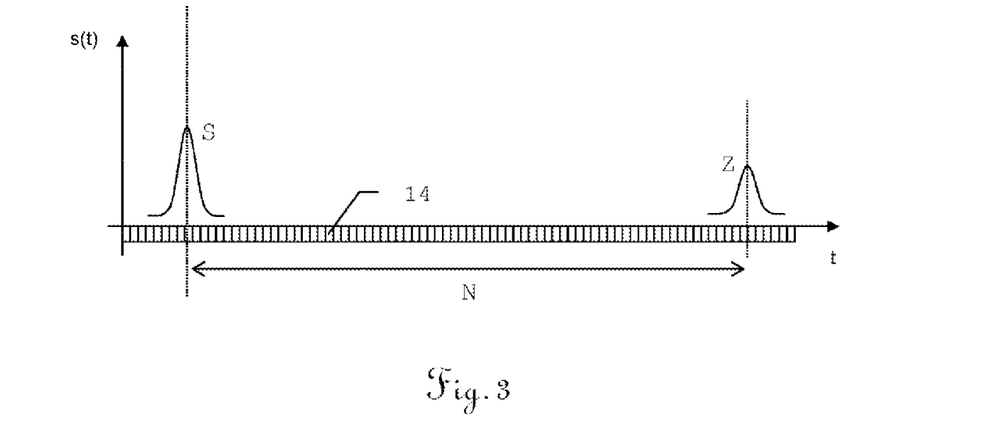

FIGS. 2-3 elucidate the time-of-flight measuring principle for a pulse time-of-flight distance measuring element according to the prior art. The measurement signal source 1 and the receiver 3 are arranged in the distance measuring element. The measurement signal source 1 emits a light pulse, which, after reflection or backscattering at a target, e.g. a retroreflector 13, is detected again as a backscattered light pulse by the receiver 3. Instead of the light pulses, a pattern, e.g. composed of a sequence of pulses, or a rectangular signal, can also be used as the measurement signal. Upon emission, part of the measurement signal for generating the start signal S is passed via the device-internal reference section, such that said signal is received earlier in time than the target signal Z reflected from the target object. This situation is illustrated in FIG. 3, wherein the signal pulses s(t) are plotted against time t and pulses are shown as signal waveforms. Start signal S and target signal Z are sampled jointly with one sampling rate by an analog-to-digital converter, wherein both signals lie in a sampling pattern composed of sampling intervals 14, said sampling pattern being defined by the sampling rate, and are spaced apart by a number n of sampling intervals. In methods from the prior art, start signal S and target signal Z are then detected at the sampling points, the signals are reconstructed and their temporal spacing is determined, for which purpose various basic methods are available, such as e.g. cross-correlation between the signals S and Z or between measurement pulses and pattern pulses stored in the memory. From the temporal spacing, i.e. the signal time of flight via the device-external measurement section, the associated distance to the target is then determined in a known manner.

Figure 4:
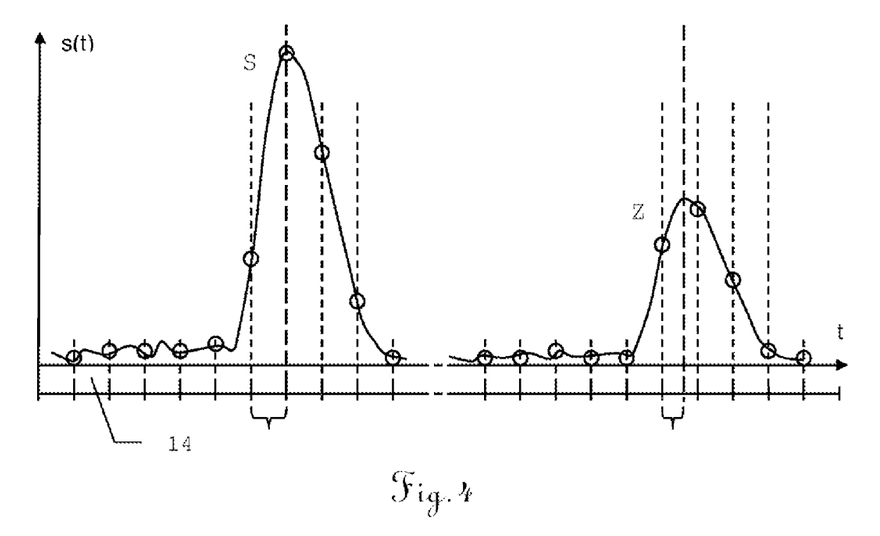
FIGS. 4-5 show the basic illustration of the distance measuring method according to the invention.
Figure 5:
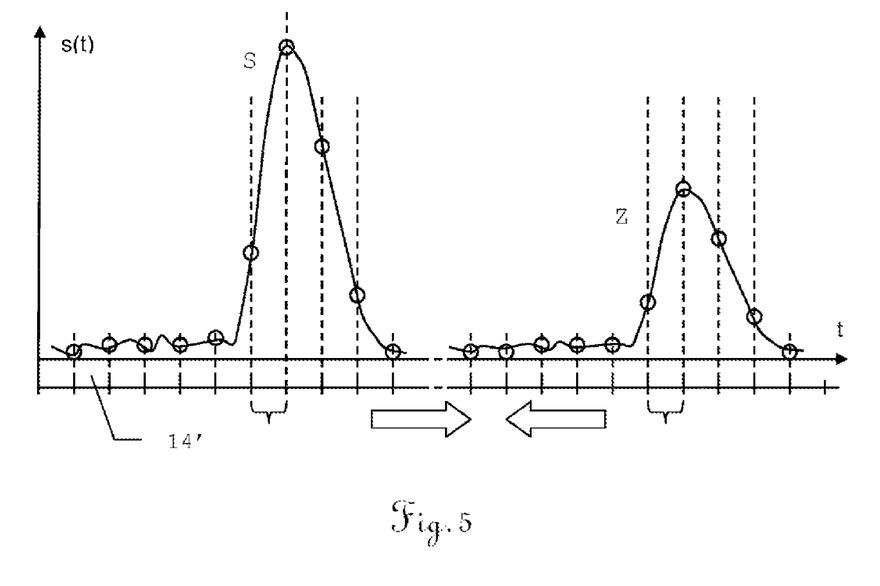

FIGS. 4-5 elucidate the distance measuring principle according to the invention. They show the enlarged excerpts corresponding to FIG. 3 for the start signal S and the target signal Z, wherein in this example the target signal Z is shown as an attenuated copy of the start signal S. In reality, however, distortions can also occur for the target signal Z. FIG. 4 reveals that start signal S and target signal Z have different relative positions in relation to the sampling pattern defined by sampling intervals 14, wherein the sampling intervals 14 constitute the time periods and thus spacings between two sampling points. In this regard, for the start signal S the peak point coincides with a sampling point, whereas the peak point for the target signal Z lies in the sampling interval and thus between two sampling points. Consequently, both signals are sampled at different points of their signal profile and aliasing effects can occur during the subsampling interpolation, said aliasing effects leading to errors in the distance measurement.

According to the invention, the same signal profile, i.e. a copy of start signal S and target signal Z, is sampled again or in parallel, wherein with knowledge of the coarse distance an appropriate sampling rate with assigned sampling pattern is selected, set and used for precise measurement, such that sampling takes place at other locations of the signal profile. In the example of the joint sampling of start signal S and target signal Z, these sampling locations shift along the signal profile. A situation that is desired according to the invention occurs if the shortening of the sampling intervals 14' that is shown in FIG. 5 has the effect that start signal S and target signal Z are sampled with an identical phase angle, i.e. without a phase shift with respect to one another. In this case, edges and peak points of the two signals are sampled in an identical manner, such that both signals are positioned identically relative to the sampling pattern. It is likewise possible according to the invention to multiply repeat the emission and reception and sampling processes and to accumulate the sampled values for start signal S and/or target signal Z before determining their temporal spacing.

Besides the use of coarse distances from device-external information or on the basis of a coarse distance measurement by different methods, the sampling rate for the second sampling can also be chosen on the basis of a result of a first sampling, and thus on the basis of a coarse distance to the target object that is based on the first sampling. Methods for a coarse distance measurement which are suitable according to the invention but are not sampling methods include e.g. a pulse time-of-flight measurement according to the threshold value method or triangulation methods. In the case of measurement tasks with a sequence of many measurements and objects that are not structured to an excessively great extent, by way of example it is also possible to use previous measurements to neighboring points as coarse distances. In this case, the sampling rate can be selected by being taken from a table in which suitable sampling rates are assigned to coarse distances. Such tables can be created in particular on the basis of previous distance measuring processes, such as e.g. during construction site monitoring, or from the predefinition of setpoint distances to be checked or to be monitored.

Given the presence of a coarse distance and a predefined desired sampling resolution with associated predefined sampling rate, the sampling rate for the fine measurement can then be set in accordance with the following relationship:

$$f = \lfloor N \rfloor \cdot \frac{c}{2D}$$

wherein f denotes the sampling rate to be set for the sampling, c denotes the speed of light in the transmission medium air, D denotes the coarse distance and $\lfloor N \rfloor$ denotes the rounding-down function for the number of sampling intervals 14 between the start signal S and the target signal Z which arise in the case of the rate corresponding to the predefined sampling resolution.

The predefined sampling rate serves as initial variable for the fine sampling rate that is then to be adapted and set with regard to optimality, wherein said fine sampling rate is usually chosen with a slightly lower frequency than the predefined sampling rate. In principle, however, an adaptation to higher-frequency sampling rates is also possible.

However, the sampling rate for the second sampling can also be chosen by an identical method for the coarse distant measurement in accordance with the following relationship:

$$f_{n+1} = f_n \cdot \lfloor N \rfloor / N$$

wherein $f_{n+1}$ denotes the sampling rate to be chosen for the second sampling, $f_n$ denotes the sampling rate for the first sampling, N denotes the number of sampling intervals 14 between the start signal S and the target signal Z, and $\lfloor N \rfloor$ denotes the rounding-down function for the number of sampling intervals 14 between the start signal S and the target signal Z at fn.

Given a start sampling rate or frequency of $f_n$=500 MHz, by way of example N=789.358 results as the number of sampling intervals situated between start signal and target signal.

The associated distance D can be calculated in accordance with $$D = \frac{N}{f_n} \cdot \frac{c}{2} = 236.807 \text{ m}$$

wherein c denotes the speed of light.

The second sampling rate to be chosen results in accordance with $$f_{n+1} = f_n \cdot \lfloor N \rfloor / N = 500 \text{ MHz} \cdot \frac{789}{789.358} = 499.773 \text{ MHz}$$

On the apparatus side, this is realized by the sampling frequency of the analog-to-digital converter being generated by a frequency generator, such as e.g. a synthesizer (N, fractional-N or DDS (direct digital synthesizer)). This approach is limited by the setting accuracy of the frequency generator and the quality of the previous distance measurement or the previous samplings.

According to the invention, however, the sampling rate to be chosen can also be chosen in an analogous manner by means of a rounding-up function $\lceil N \rceil$ thus resulting in the following alternative relationships:

$$f = \lceil N \rceil \cdot \frac{c}{2D} \text{ or } f_{n+1} = f_n \cdot \lceil N \rceil / N$$

Another possibility according to the invention consists in varying the sampling rate for the second sampling until the first derivative of the signal or of the signal pulse at the sampling points of the target signal Z is maximal, or ending the variation if the first derivative decreases again. This approach can thus be restricted to the exclusive consideration of the variations of the target signal Z and thus also allows the use of an electronically generated start signal S, which can thus differ completely from the target signal Z in terms of its characteristic and its signal processing.

According to the invention, this approach of sampling with at least two different sampling rates can also be combined with a filtering, as described in WO 2011/076907, for example, such that the digitization is preceded by a filtering.

Figure 6:
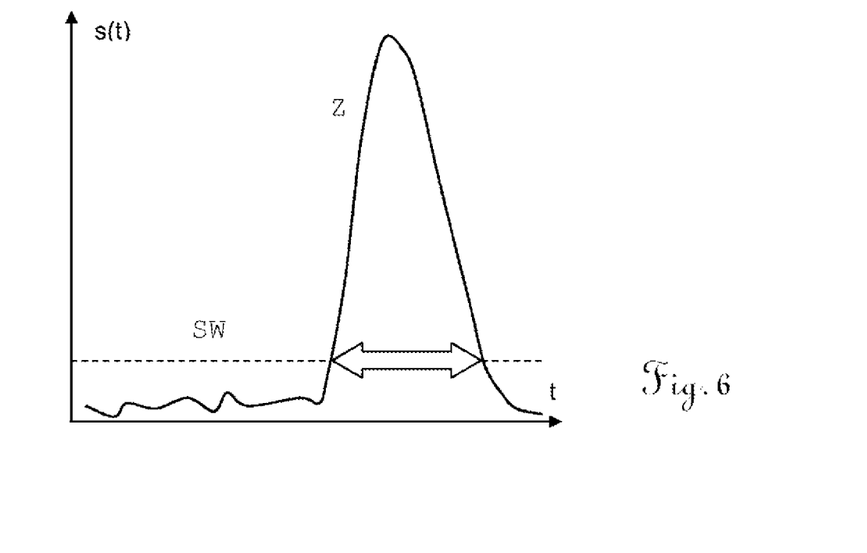
FIG. 6 shows the basic illustration of a distance measuring method according to the threshold value principle according to the prior art.

FIG. 6 elucidates a threshold value method suitable for the coarse distance measurement for backscattered light signals as target signal Z according to the prior art, as also described in WO 2008/009387, for example. In order that noise, background components or systematic interference signals such as, for example, as a result of optical and electrical crosstalk between transmitter signal path and receiver signal path can be suppressed and excluded from detection, a detection threshold SW is used. Signal intensities s(t) below said detection threshold SW do not lead to a response of the receiving unit, which generates a stop signal, to the target signal Z and therefore do not lead to detection. If the intensity of the target signal Z exceeds the detection threshold SW, the detection and thus the generation of the stop signal and the registration of the reception instant take place. The output signal provided by the threshold value method is thus dependent on the detection threshold SW being reached or exceeded by the received target signal Z.

Figure 7A:
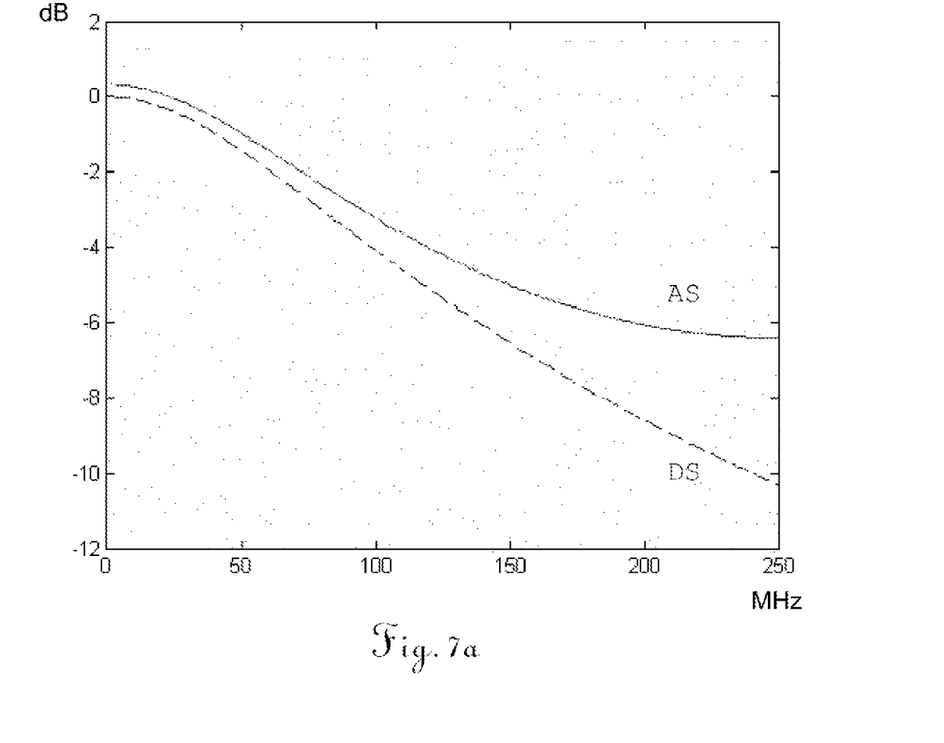
FIGS. 7a-b show the different spectra for 1st and 2nd order filters.
Figure 7B:
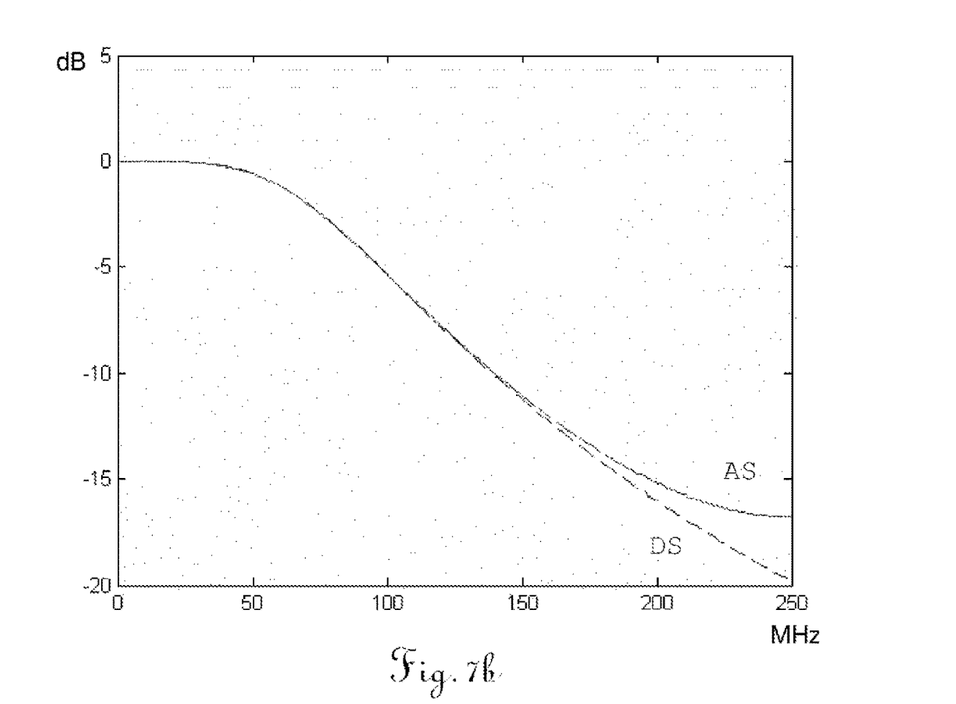

The different spectra of suitable first- and second-order filters are illustrated in FIGS. 7*a-b*, said filters being low-pass filter types having a 3 dB limit frequency BW of 80 MHz at a sampling rate of 500 MHz. The frequency in MHz is indicated on the horizontal axis and the attenuation in dB is indicated on the vertical axis, wherein the solid line represents the analog signal AS and the dashed lines represent the digital signal DS. FIG. 7*a* shows a first-order filter, and FIG. 7*b* shows a second-order filter.

Figure 8A:
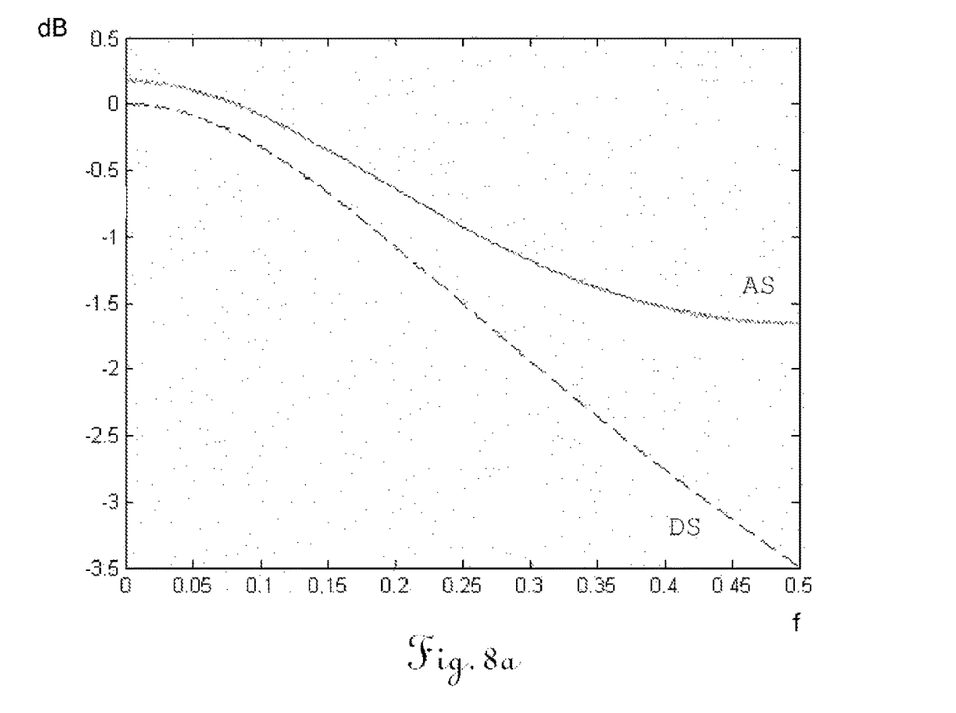
FIGS. 8a-b show the different spectra for 1st and 2nd order filters as a function of the sampling rate.
Figure 8B:
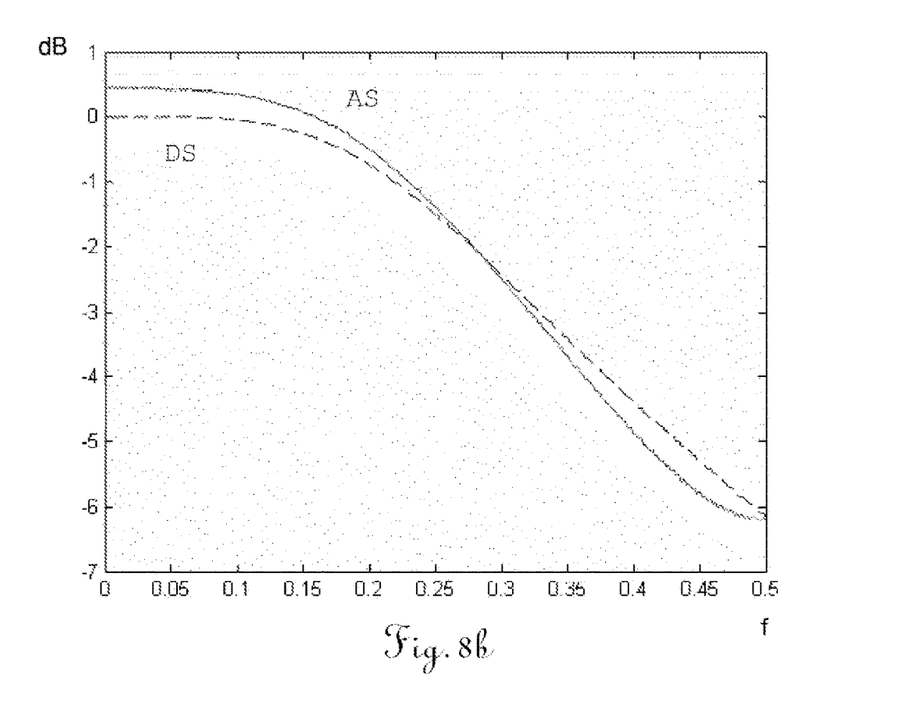

The spectra of the same filters are shown as a function of the sampling rate in FIGS. 8*a-b*, wherein the frequency in units of the sampling rate indicated on the vertical axis.

Figure 9A:
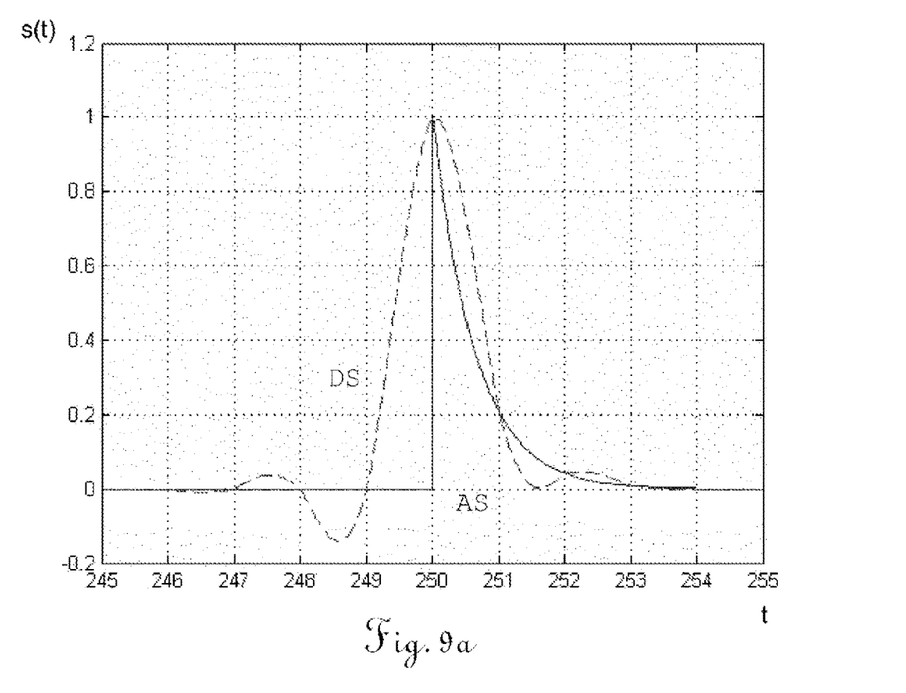
FIGS. 9a-c show the differences between analog time signal and digital signal interpolated therefrom for a 1st order filter and different relative positions between signal and sampling pattern.
Figure 9B:
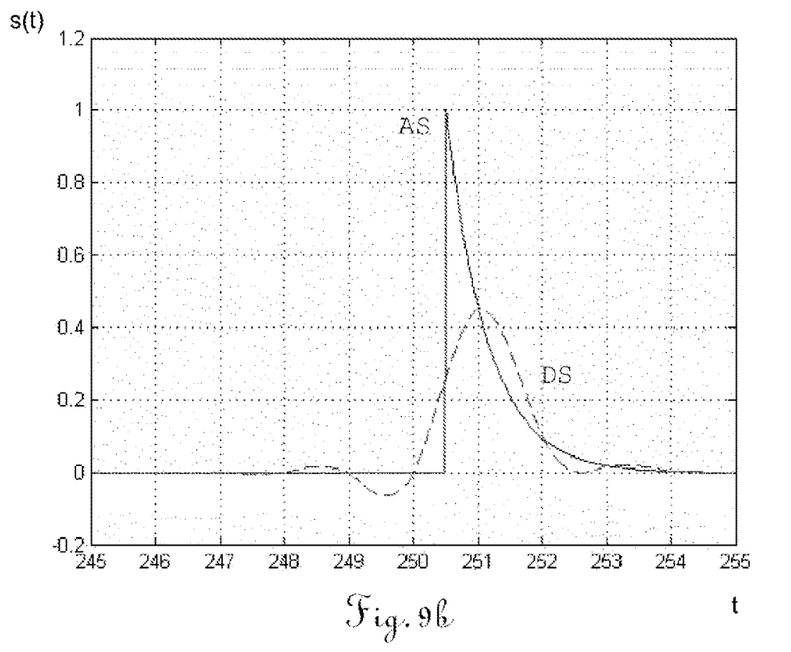
Figure 9C:
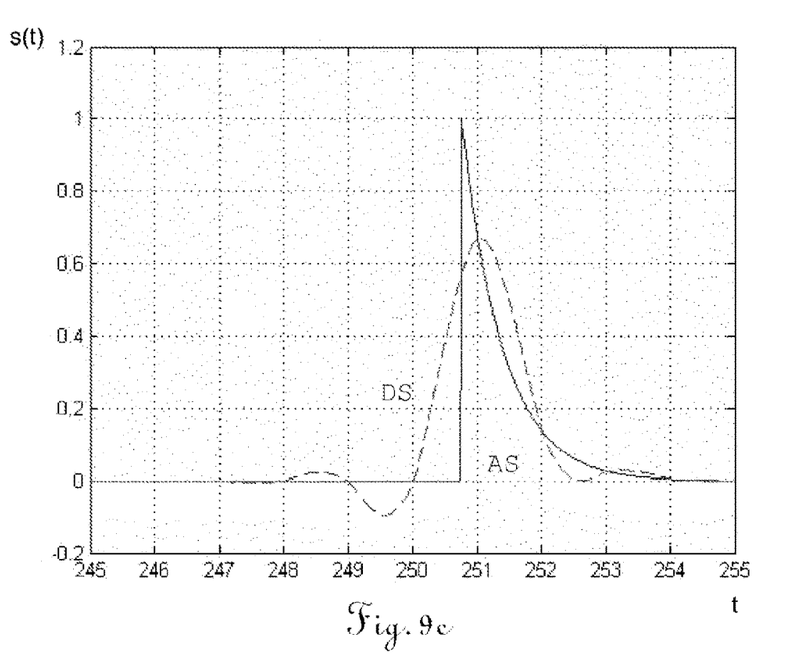

FIGS. 9*a-c* illustrate the differences between analog time signal AS and digital signal DS interpolated therefrom for a first-order filter and different exemplary relative positions between time signal and sampling pattern. The analog time signal AS depicted as a solid line is illustrated at three different positions in relation to the sampling pattern in FIGS. 9*a-c*. In FIG. 9*a*, the maximum of the time signal lies exactly at the sampling point of the sampling pattern that is marked with the time unit 250, wherein the digital signal DS interpolated from the sampled time signal AS has identical values at the sampling points and deviates in the intermediate regions. In FIG. 9*a*, the maximum of the time signal AS lies directly in the sampling pattern, wherein the maximum of the digital signal DS as a reconstruction is also situated at this location. In the following FIGS. 9*b-c*, the temporal position of the time signal AS shifts toward the right relative to the sampling pattern, such that the maximum of the time signal AS is now situated between the sampling points with the time units 250 and 251. It is evident that, in the case of these different relative positions, different positions of maximum and centroid of the digital signal DS also follow, thus giving rise to a dependence of the signal reconstruction on the relative position of the time signal AS in the sampling pattern, which leads to distance errors.

Figure 10A:
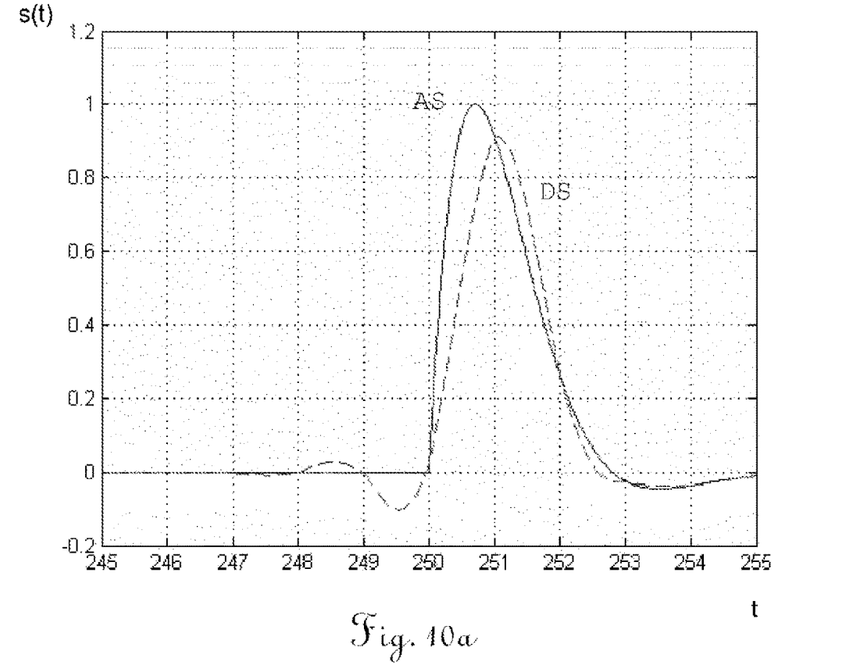
FIGS. 10a-c show the differences between analog time signal and digital signal interpolated therefrom for a 2nd order filter and different relative positions between signal and sampling pattern.
Figure 10B:
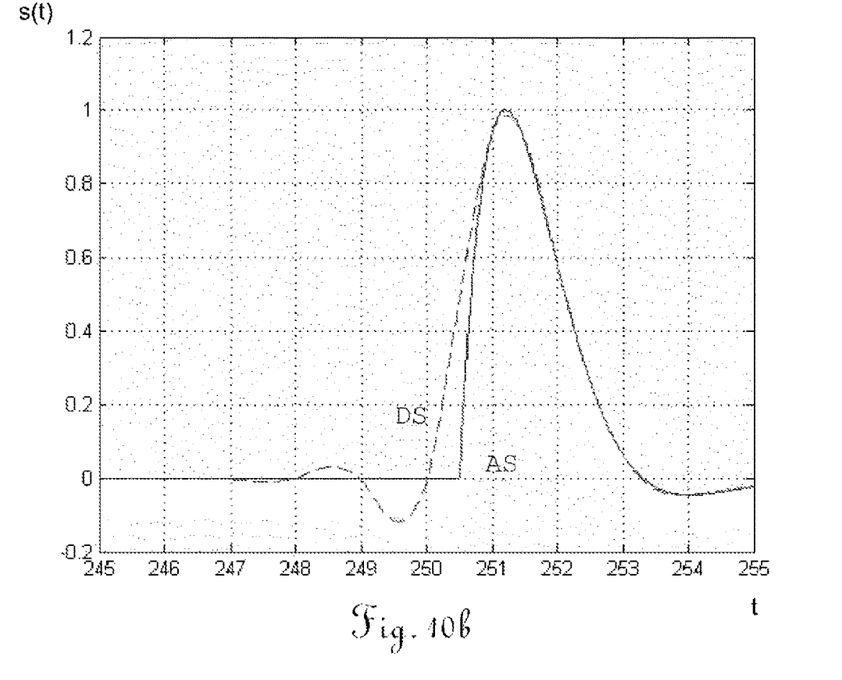
Figure 10C:
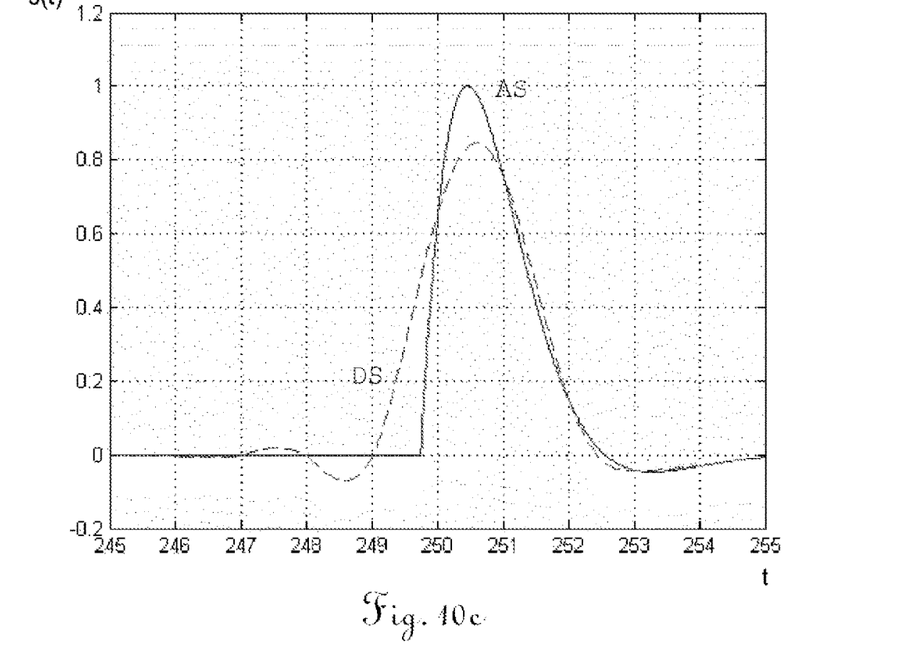

FIGS. 10*a-c* show the corresponding differences between analog time signal and digital signal interpolated therefrom for a second-order filter, wherein on account of the filtering the deviations between the signal profiles and thus also the distance errors turn out to be smaller.

Figure 11A:
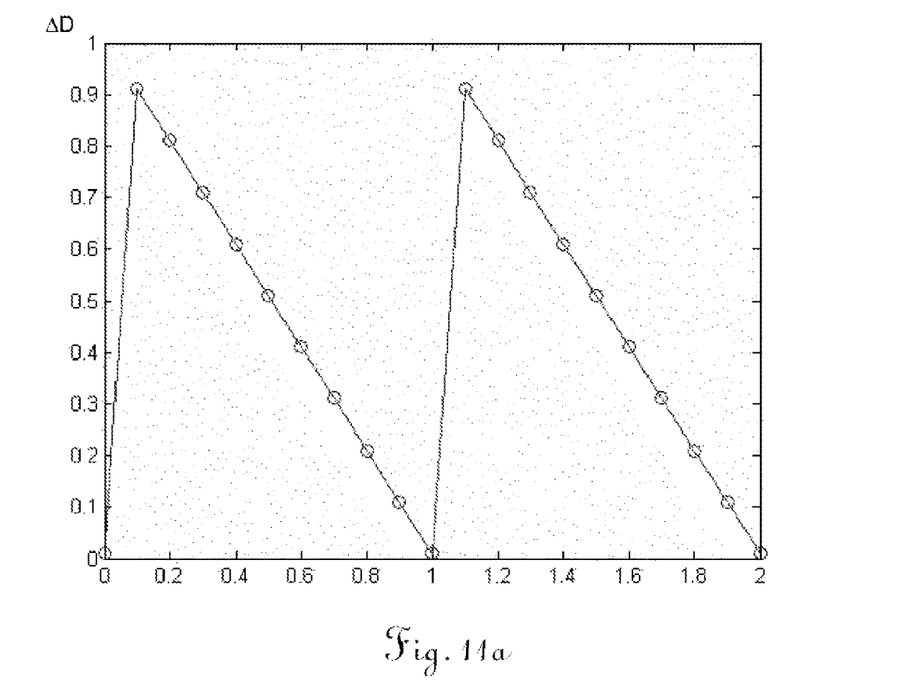
FIGS. 11a-b show the occurrence of distance errors during the sampling of a signal with filters of different orders and relative positions between signal and sampling pattern.
Figure 11B:
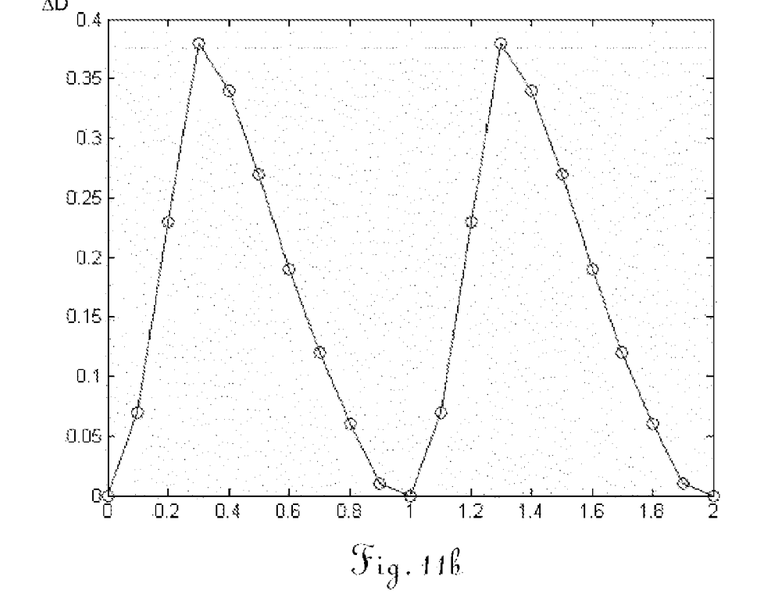

FIGS. 11*a-b* illustrate the occurrence of distance errors ΔD during the sampling of a signal with filters of different orders and relative positions between signal and sampling pattern. They show the error arising as a result of the different relative pattern positions during the determination of the temporal position of the signal to be reconstructed relative to a reference point in time, wherein the distance to be determined follows from the temporal position via the signal time of flight. The distance error becomes evident which arises if the position is determined by means of a digitally interpolated signal. The position of the maximum values of the analog signal and of the digitally interpolated signal is assumed as time position. The distance error ΔD as the difference between the position of the maximum values is shown on the vertical axis.

The horizontal axis denotes the shift of the sampling pattern in units of the spacing of the sampling points, i.e. the shift of the signal in relation to the sampling pattern. In the case of the first-order filter as illustrated in FIG. 11a, it is evident that the error rises linearly and the true distance is given only for the case of correspondence of maximum value and sampling point. FIG. 11b shows the same situation for a second-order filter.

The above consideration disregards the error that possibly arises from the additional sampling of a start signal or some other reference signal. This error is elucidated below in FIGS. 11a-b.

Figure 12A:
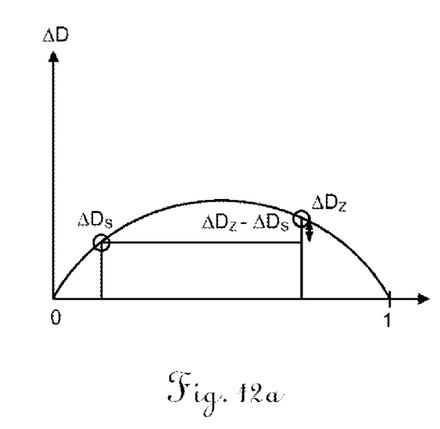
FIGS. 12a-b show the elucidation of the total errors for distance measuring methods from the prior art in comparison with the distance measuring method according to the invention.
Figure 12B:
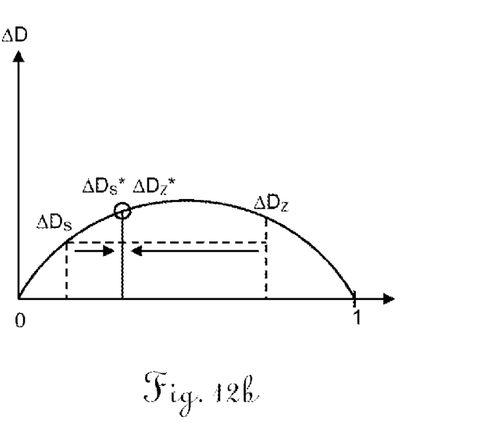

FIGS. 12a-b elucidate the total error for distance measuring methods from the prior art in relation to the distance measuring method according to the invention.

FIG. 12a illustrates the subsampling interpolation disturbed by aliasing effects, and the resultant error $\Delta D_S$ for the start signal and the error $\Delta D_Z$ for the target signal. This figure shows the distance error $\Delta D$ that occurs within a sampling interval in relation to the shift—indicated on account of the periodicity in the interval zero to one—or relative position of the signal centroid with respect to the sampling pattern. As is also known in the prior art, aliasing errors arise during the reconstruction or interpolation of a signal. Said aliasing errors are generally all the greater, the further the signal centroids are shifted in relation to a sampling point of the sampling pattern. Any signature of the signal that represents the time of flight can alternatively be employed instead of a signal centroid. If two signals are compared with one another, a greater or lesser total error $\Delta D_Z$–$\Delta D_S$ of the distance to be determined arises depending on the difference between their sampling instants.

By contrast, if the start signal and target signal are sampled with an identical relative position or phase shift in relation to the sampling pattern, then the resulting error decreases on account of the difference formation, as is shown in FIG. 9b for the shift—brought about by the setting of the sampling rate—of the errors $\Delta D_S$ and $\Delta D_Z$ for the start and target signals to $\Delta D_S^*$ and $\Delta D_Z^*$. The fractional shift within the sampling interval is identical for the start and target pulses, in order that the difference $\Delta D_S^*$–$\Delta D_Z^*$ as total error also becomes zero in this case.

Figure 13:
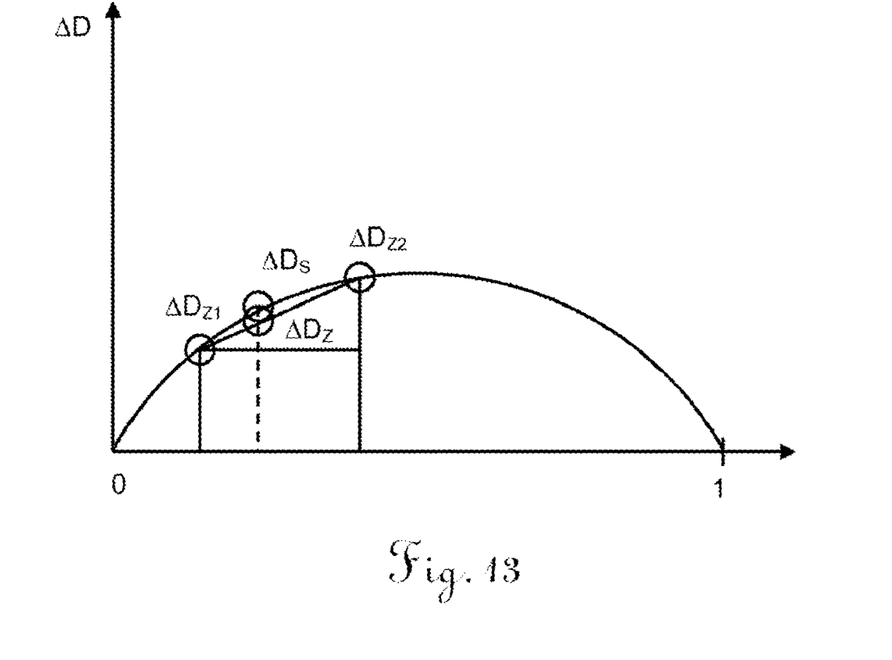
FIG. 13 shows the basic illustration of a linear interpolation according to the invention of the stop signal.

In addition, the errors occurring as a result of aliasing can also be identified or reduced or completely eliminated by multiple measurement of the same distance with additional sampling rates. A first possibility is illustrated in FIG. 13 in the form of a linear interpolation of the target signal or stop signal. In this example, the target signal is additionally sampled twice with further different rates, wherein the latter are chosen such that the resulting temporal shifts lie on both sides of the likewise sampled start signal. The two distance errors $\Delta D_{Z1}$ and $\Delta D_{Z2}$ for the two target signals and the distance error $\Delta D_S$ for the start signal unchanged in its relative position with respect to the sampling pattern are thus detected from the measurements. Even if the two values $\Delta D_{Z1}$ and $\Delta D_{Z2}$ are not present explicitly, the difference $\Delta D_{Z2}$–$\Delta D_{Z2}$ and with the associated time shifts (sub-intervals) is known. From the difference between the two distance errors $\Delta D_{Z2}$ and $\Delta D_{Z2}$, by means of linear interpolation it is subsequently possible to calculate a synthetic distance error $\Delta D_Z$ as an interpolated rather than directly measured value for a target signal shifted in relation to the sampling pattern by the same magnitude as the start signal. With the aid of this synthetic value, the error can then be largely or completely eliminated.

Figure 14:
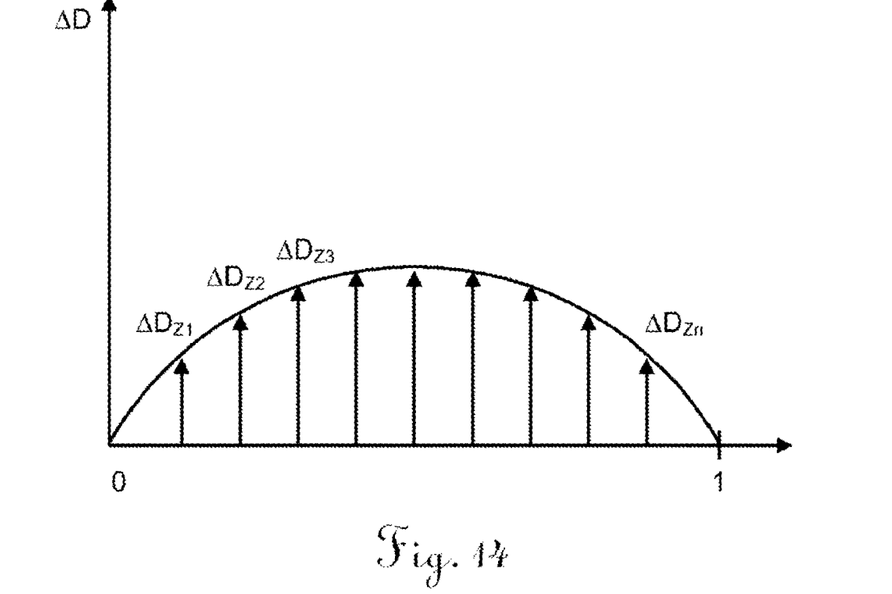
FIG. 14 shows the basic illustration of a look-up table creation according to the invention.

In order to increase the distance measuring accuracy even further, the systematic distance errors that occur in the case of corresponding shifts in relation to the sampling pattern can be determined for different sampling rates, measurement distances and configurations (e.g. different target and signal waveforms), and can be stored in a table according to the invention. This case is shown in FIG. 14 in the form of a basic illustration of a look-up table creation according to the invention, which involves determining, for an unchanged distance and measurement configuration, the different distance errors $\Delta D_{Z1}$, $\Delta D_{Z2}$, $\Delta D_{Z3}$ to $\Delta D_{Zn}$ for n discrete sampling rates and, resulting therefrom, n shifts in relation to the sampling pattern. By way of example, multiple measurements of the same distance by means of a plurality of different frequencies make it possible to record the complete curve $\Delta D$ over the entire interval between two sampling points. FIG. 14 illustrates the result of a series of n measurements with equidistant shifts.

What is claimed is:

1. A distance measuring method, comprising at least:
    emitting at least a first measurement signal to a target object, wherein at least one start signal is generated;
    receiving the measurement signal backscattered from the target object as a target signal;
    sampling the target signal with a sampling frequency and determining a relative position of the at least one start signal and the target signal, wherein the target signal is sampled at sampling points of a sampling pattern defined by the sampling frequency; and
    deriving a distance to the target object from the relative position of the start signal and the target signal;
    wherein the sampling frequency is adjustable and is set in a manner dependent on a coarse distance to the target object.

2. The distance measuring method as claimed in claim 1, wherein:
    the sampling frequency is set such that a respective position of the at least one start signal and the target signal relative to the sampling pattern is identical, such that the start and target signals are sampled at identical locations of a respective signal profile.

3. The distance measuring method as claimed in claim 1, wherein the sampling frequency is set in accordance with at least one of the following relationships:

$$f = \lfloor N \rfloor \cdot \frac{c}{2D} \text{ and } f = \lceil N \rceil \cdot \frac{c}{2D}$$

wherein:
    f denotes the sampling frequency to be set for sampling,
    c denotes the speed of light,
    D denotes the coarse distance,
    N denotes a number of sampling intervals between the at least one start signal and the target signal,
    $\lfloor N \rfloor$ denotes a rounding-down function, and
    $\lceil N \rceil$ denotes a rounding-up function for the number of sampling intervals between the start signal and the target signal.

4. The distance measuring method as claimed in claim 1, wherein a synthetic distance error is determined for the target signal by linear interpolation of the target signal shifted in terms of its position.

5. The distance measuring method as method as claimed in claim 1, wherein the coarse distance to the target object is ascertained by means of a coarse distance measurement.

6. The distance measuring method as claimed in claim 5, wherein:
    emitting, receiving and sampling are carried out for a-the first and a second measurement signal, wherein a coarse distance is derived from the first measurement signal and the sampling frequency for sampling the second measurement signal is set in a manner dependent on the coarse distance thus determined.

7. The distance measuring method as claimed in claim 5, wherein:
the coarse distance to the target object is ascertained in a manner dependent on a time of flight by virtue of the backscattered measurement signal being detected if an intensity thereof exceeds a predefined threshold value.

8. The distance measuring method as claimed in claim 1, wherein:
the sampling frequency is taken from a table in which suitable sampling frequencies are assigned to coarse distances, wherein the assignment of coarse distances to sampling frequencies is effected on the basis of previous distance measuring processes.

9. The distance measuring method as claimed in claim 1, wherein the sampling frequency is varied until a first derivative at the sampling points of the target signal is maximal.

10. The distance measuring method as claimed in claim 1, wherein the measurement signal comprises a light signal.

11. A distance measuring element comprising at least:
a measurement signal source for emitting at least one measurement signal to a target object, wherein at least one start signal is generated;
a receiver for detecting the measurement signal backscattered from the target object as a target signal;
a sampling circuit for sampling the received target signal for determining the relative position of the start signal and the target signal, wherein the target signal is sampled at sampling points of a sampling pattern defined by a sampling frequency;
a control and evaluation component for deriving a distance to the target object from a relative position of the start signal and the target signal;
wherein the sampling circuit is designed such that the sampling frequency is adjustable and is settable.

12. The distance measuring element as claimed in claim 11, wherein the sampling circuit has a frequency generator.

13. The distance measuring element as claimed in claim 11, wherein the sampling circuit comprises a frequency synthesizer.

14. The distance measuring element as claimed in claim 11, wherein:
a time-of-flight-measuring measurement circuit for coarse distance measurement, which is designed such that the backscattered measurement signal is detected if an intensity thereof exceeds a predefined threshold value.

15. The distance measuring as claimed in claim 11, wherein:
a storage unit for storing coarse distances for previously known target objects.

16. The distance measuring element as claimed in claim 11, wherein a coarse distance measurement signal source and a coarse distance receiver are designed and arranged such that they define a second measurement path independent of the measurement signal source and the receiver.

17. The distance measuring element as claimed in claim 11, wherein the at least one start signal is generated by splitting the measurement signal.

18. The distance measuring element as claimed in claim 11, wherein the sampling circuit is automatically settable, in a manner dependent on a coarse distance to the target object.

19. The distance measuring element as claimed in claim 11, wherein the sampling circuit comprises at least one of a direct digital synthesizer, fractional-N synthesizer, and a voltage-controlled and phase-locked-loop-based integer-N synthesizer.

20. The distance measuring element as claimed in claim 11, wherein the measurement signal comprises a light signal.

* * * * *

UNITED STATES PATENT AND TRADEMARK OFFICE
CERTIFICATE OF CORRECTION

PATENT NO. : 10,120,077 B2
APPLICATION NO. : 14/406475
DATED : November 6, 2018
INVENTOR(S) : Reto Stutz Page 1 of 1

It is certified that error appears in the above-identified patent and that said Letters Patent is hereby corrected as shown below:

In the Claims

In Column 12, Claim 3, Line 53, delete "$\lfloor N \rfloor$" and insert -- $\lfloor N \rfloor$ --, therefor.

In Column 12, Claim 3, Line 54, delete "$\lfloor N \rfloor$" and insert -- $\lceil N \rceil$ --, therefor.

Signed and Sealed this
Eighth Day of January, 2019

Andrei Iancu
*Director of the United States Patent and Trademark Office*